United States Patent [19]

Kimura

[11] Patent Number: 4,541,122
[45] Date of Patent: Sep. 10, 1985

[54] RECEIVER INCLUDING FET FREQUENCY MIXER

[75] Inventor: Katsuji Kimura, Tokyo, Japan

[73] Assignee: Nippon Electric Company Ltd., Japan

[21] Appl. No.: 467,790

[22] Filed: Feb. 18, 1983

[30] Foreign Application Priority Data

Feb. 22, 1982 [JP] Japan .................. 57-24444[U]

[51] Int. Cl.³ .............................. H04B 1/26
[52] U.S. Cl. .................... 455/236; 455/253; 455/319; 455/333
[58] Field of Search ............ 455/318, 319, 333, 236, 455/250, 251, 249, 253, 241, 247

[56] References Cited

U.S. PATENT DOCUMENTS

| 1,905,946 | 4/1933 | Mathieu et al. | 455/251 |
| 2,144,935 | 1/1939 | Roberts | 455/236 |
| 4,270,222 | 5/1981 | Menant | 455/318 |

OTHER PUBLICATIONS

Build a Superhet Short Wave Receiver–I. Pogson, Electronics–Australia, Nov. 1980, vol. 42, No. 8, pp. 44–53.

Primary Examiner—Marc E. Bookbinder
Attorney, Agent, or Firm—Ostrolenk, Faber, Gerb & Soffen

[57] ABSTRACT

A receiver including an FET frequency mixer is disclosed. A local oscillator generates a local oscillator signal which is applied to a first amplifier whose gain is varied as a function of a control signal applied thereto. The output of the first amplifier is applied to a first gate electrode of the FET frequency mixer. A high-frequency signal received by the receiver is applied to a second amplifier whose gain is also controlled by the control signal. The output of the second amplifier is applied to a second gate electrode of the FET frequency mixer. The control signal is generated as a function of the output of the FET mixer.

5 Claims, 4 Drawing Figures

RECEIVER INCLUDING FET FREQUENCY MIXER

BACKGROUND OF THE INVENTION

The present invention relates to a receiver having a field effect transistor (FET) frequency mixer, and more particularly to a circuit for controlling the frequency conversion gain in an FET frequency mixer circuit.

To stabilize the level of a received signal wave, a high frequency amplifier with automatic gain control (AGC) has been used. If it is not possible to achieve a sufficiently wide AGC dynamic range by the use of only the AGC high frequency amplifier, the use of a high frequency mixer with AGC function is conceivable. The AGC function can be obtained by, for instance, controlling the gate voltage of a dual gate FET mixer. This gate voltage control, however, is usually operated at a local input level of around 1 V. In this case, even if the D.C. voltage of the gate is a pinch-off voltage, there will be biasing at the local input level, resulting in the failure of the FET to be pinched off. Therefore, the dynamic range of the conversion gain $MG_T$ of the mixer cannot be readily expanded merely by controlling the gate voltage of the FET and, moreover, this difficulty is accompanied by the instability of the mixer circuit owing to the variation of the D.C. biasing. For details of a mixer using an FET, reference is made to the U.S. Pat. No. 4,112,373 issued on Sept. 5, 1978.

SUMMARY OF THE INVENTION

An objective of the present invention, therefore, is to provide a receiver with a stably operating FET frequency mixer circuit, permitting the AGC dynamic range of the mixer circuit to be expanded to be equal to that of the local AGC amplifier circuit and enabling AGC to be applied over a wide dynamic range.

According to the invention, there is provided a receiver comprising: an FET frequency mixer means having first and second gates; local oscillator means for generating a local oscillator signal; first variable gain means coupled to said first gate for varying the gain of a high frequency signal received by the receiver in response to a control applied thereto, second variable gain means coupled to said second gate for varying the gain of said local oscillator signal means in response to said control signal; and generator means coupled to the output of said FET mixer means for generating said control signal.

BRIEF DESCRIPTION OF DRAWINGS

Other objectives and features of the invention will be more apparent from the detailed description hereunder taken in conjunction with the accompanying drawings, wherein.

DETAILED DESCRIPTION OF THE INVENTION

Figure 1:
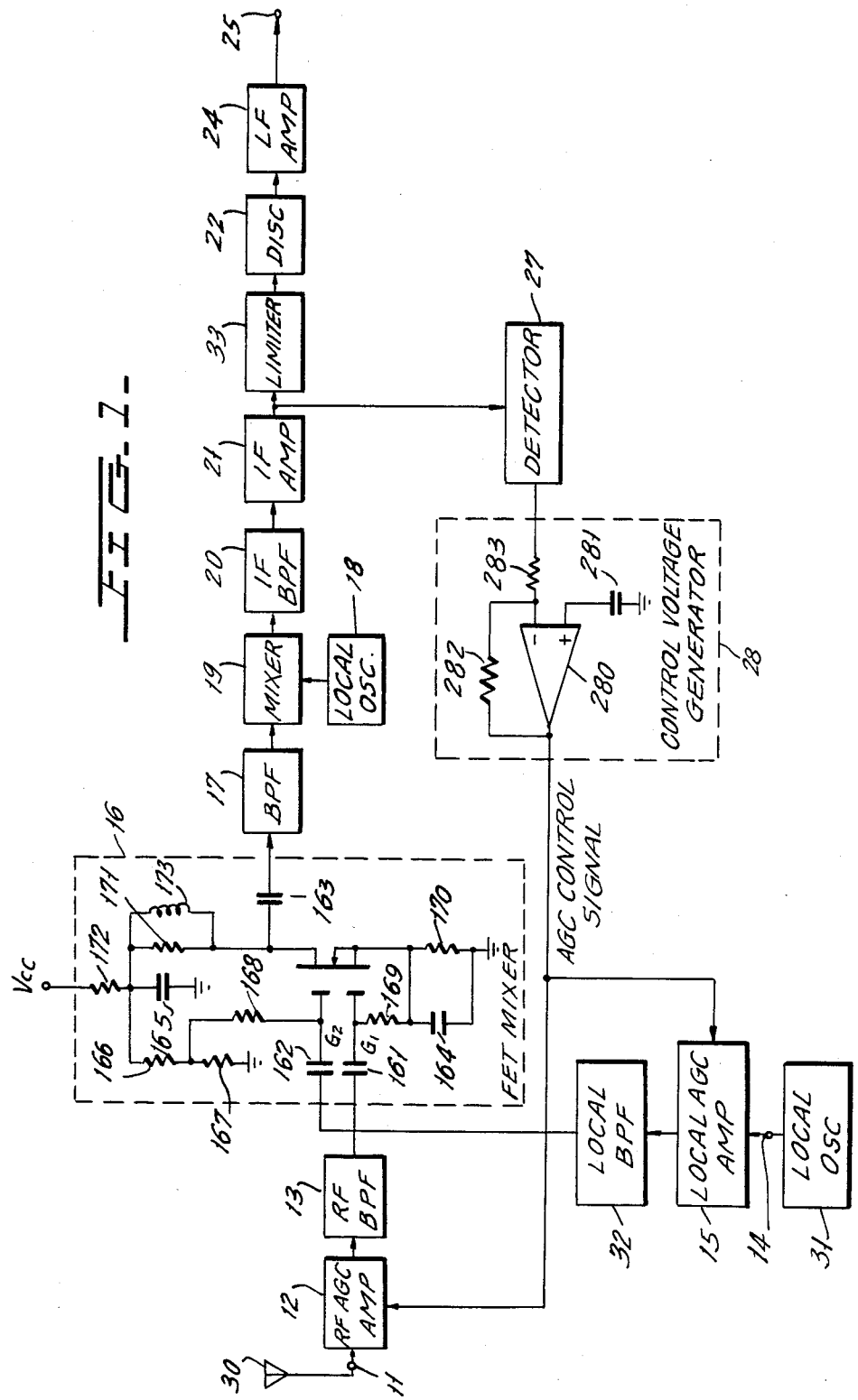
FIG. 1 is a circuit diagram illustrating an embodiment of superheterodyne receiver according to the invention.

Referring to FIG. 1, an FM RF signal received by an antenna 30 is applied to an input terminal 11 of a well-known RF AGC amplifier 12 (whose output signal is gain-controlled by an AGC signal), filtered by an RF band-pass filter (BPF) 13, and supplied to a gate $G_1$ of an FET mixer 16 by way of a coupling capacitor 161. Meanwhile, a local oscillation signal from an output terminal 14 of a local oscillator 31 is supplied to a local AGC amplifier 15, whose output signal is gain-controlled in response to the AGC signal, filtered by a local filter 32, and supplied to a gate $G_2$ of the FET mixer 16 by way of a coupling capacitor 162. Here, the FET mixer 16 is composed of a dual gate FET 160 (for example, 3SK74 manufactured and marked by Nippon Electric Co., Ltd.), capacitors 161 to 165, resistors 166 to 172 and a coil 173. The RF signal supplied to the gate $G_1$ and the local oscillation signal supplied to the other gate $G_2$, after being mixed together, are applied via the coupling capacitor 163 to a band-pass filter (BPF) 17 to be filtered. In a mixer 19, the output of the filter 17 is mixed with the output of a local oscillator 18 to provide an intermediate frequency (IF) signal through an IF BPF 20. The IF signal is amplified by an IF amplifier 21, whose output, after being sufficiently amplified by a limiter amplifier 33, is demodulated by a discriminator 22 and amplified by a low frequency amplifier 24 to feed a demodulated signal to a terminal 25. The output of the IF amplifier 21 is rectified by a detector 27 (a detecting diode, for example) into a D.C. voltage and supplied to one of the input terminals of an operational amplifier 280 of a control voltage generator 28 by way of a resistor 283. This voltage is compared with a reference voltage 281 fed to the other input terminal of the operational amplifier 280, and the difference between the two voltages is amplified by a D.C. amplification factor $R_{282}/R_{283}(>>1)$ determined by resistors 282 and 283 to provide the output voltage of the operational amplifier 280, which, as a negative feedback control voltage for the RF AGC amplifier 12 and the local AGC amplifier 15, controls the respective amplification gains of the RF AGC amplifier and the local AGC amplifier, thereby keeping the input signal level of the detector 27 constant.

Figure 2:
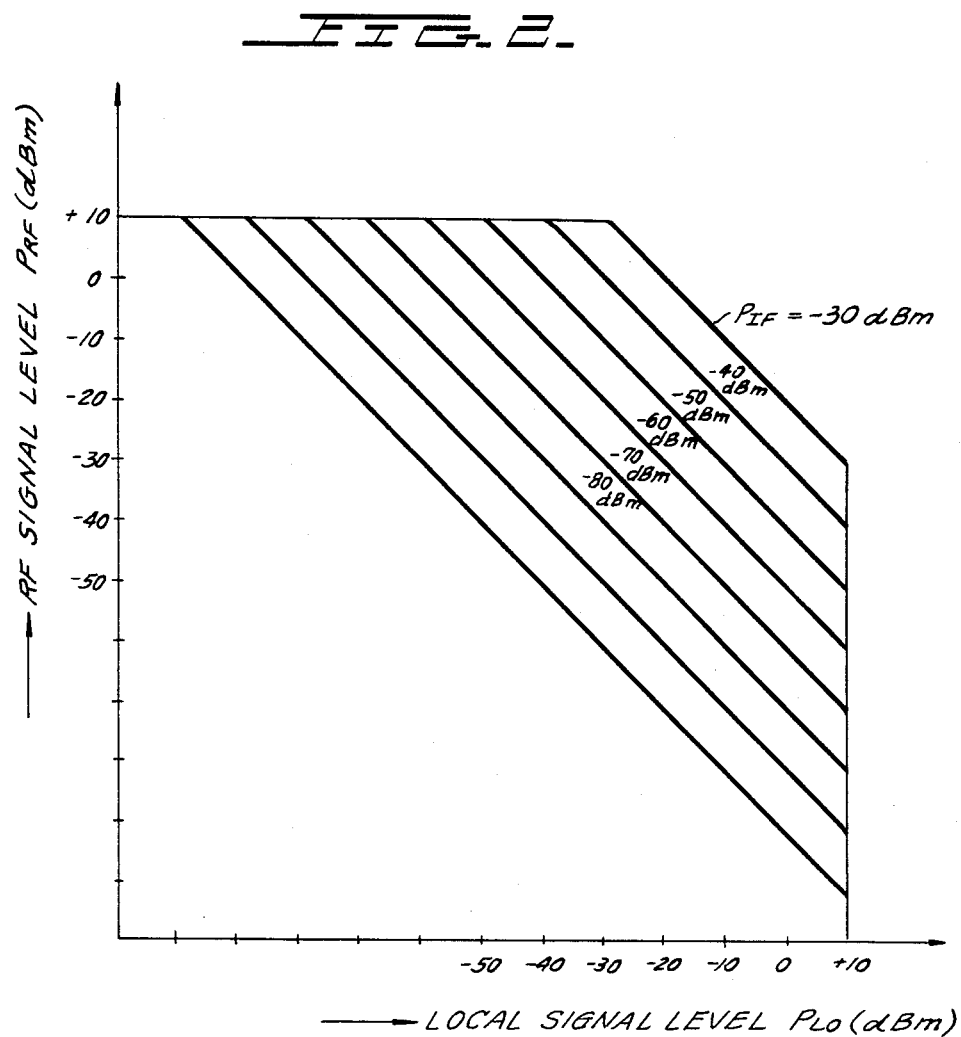
FIG. 2 shows the radio frequency (RF) signal level versus local signal level characteristic of the FET mixer, with the intermediate frequency (IF) signal level taken as parameter.
Figure 3:
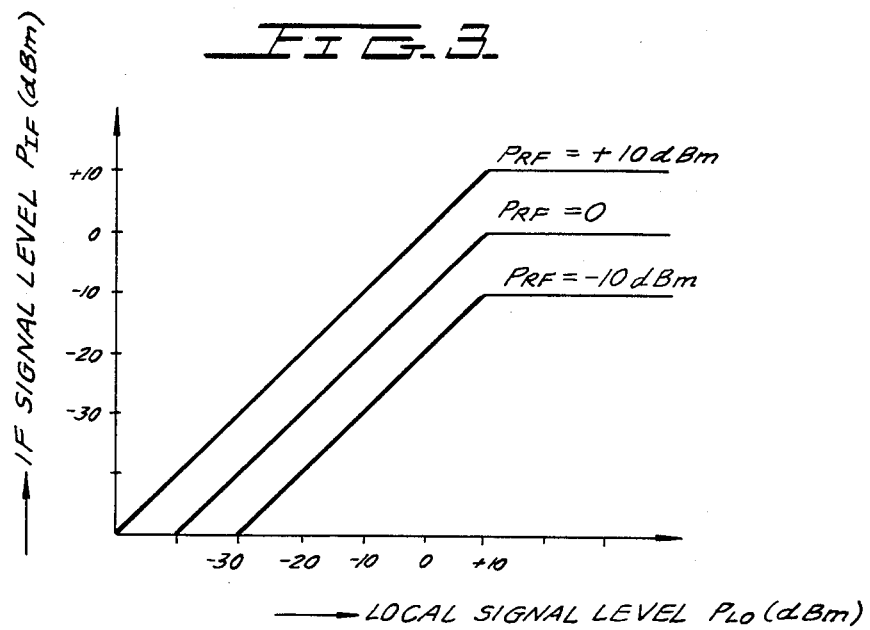
FIG. 3 shows the IF signal level versus local signal level characteristic of the FET mixer, with the RF signal level taken as parameter.
Figure 4:
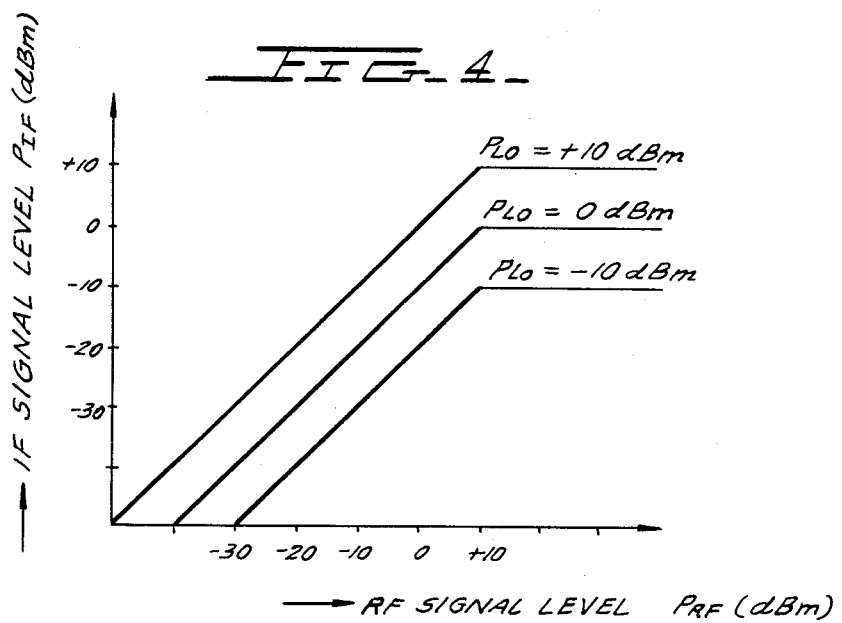
FIG. 4 shows the IF signal level versus RF signal level characteristic of the FET mixer, with the local signal level taken as parameter.

The characteristics of the FET mixer 16 are shown in FIGS. 2 to 4.

In FIG. 2 is shown the relationship between the RF signal level $P_{RF}$ from the RF AGC amplifier 12 and the local signal level $P_{LO}$ from the local AGC amplifier 15, with the IF signal level $P_{IF}$ taken as parameter. FIG. 2 reveals that, if the IF signal level is constant, the sum of the RF signal level and the local signal level will be constant when the IF signal output is unsaturated (i.e., in the slanted portion of the curves of FIG. 2). Thus if, for instance, $P_{IF} = -30$ dBm, $P_{RF} + P_{LO} = -20$ dBm.

FIG. 3 shows the relationship between the local signal level and the IF signal level, with the RF signal level taken as parameter. The diagram indicates that, if the RF signal level is constant, the IF signal level will be proportional to the local signal level when the IF signal output is unsaturated.

In FIG. 4 is plotted the relationship between the RF signal level and the IF signal level against the parameter of a constant local signal level. The figure shows that, if the local signal level is constant, the IF signal level will be proportional to the RF signal level when the IF signal output is unsaturated.

It is thus seen that, if the ratio $P_{IF}/P_{RF}$ between the IF signal level and the RF signal level is considered to be the conversion gain $MG_T$ of the mixer, this conversion gain $MG_T$ will be proportional to the local signal input level and the RF signal input level when the IF signal output is unsaturated. Therefore, not only does the IF signal output level of the FET mixer vary with variations of the RF signal input level, but also the conversion gain $MG_T$, and with it the IF signal output level of the FET mixer, can be varied by manipulating the local signal input level.

Thus, by controlling the gain of a controllable gain amplifier provided between the local oscillator and the local input terminal of the FET mixer, the IF signal output level of the FET mixer is made controllable and, moreover, the range in which the conversion gain $MG_T$ is equivalently controllable can be expanded to be as wide as the gain control range of the local AGC amplifier, so that, if the AGC loop is structured as illustrated in FIG. 1, the dynamic range of the FET mixer can be equivalently expanded to equal the AGC dynamic range of the local AGC amplifier.

What is claimed is:

1. A receiver comprising: an FET frequency mixer means having first and second gate electrodes biasing means providing substantially constant dc bias voltages to said mixer means local oscillator means for generating a local oscillator signal; first AGC amplifier means coupled to said first gate electrode for varying the level of a high frequency signal received by said receiver in response to a control signal; second AGC amplifier means coupled to said second gate electrode and said local oscillator means for varying the level of the said local oscillator signal in response to said control signal; and generator means responsive to the output of said FET mixer means for generating said control signal in order to expand the dynamic range of said FET frequency mixer means.

2. A receiver as claimed in claim 1, wherein said generator means comprises:
   further local oscillator means for generating a further local oscillation signal;
   further mixer means for mixing said output of said FET mixer means with said further local oscillation signal so as to generate an intermediate frequency signal;
   band pass filter means for filtering said intermediate frequency signal;
   amplifier means for amplifying said band pass filtered intermediate frequency signal;
   rectifier means for rectifying said amplified intermediate frequency signal; and
   control voltage generator means responsive to said rectified intermediate frequency signal for generating said control signal.

3. A receiver as claimed in claim 2, further including means for demodulating said amplified intermediate frequency signal so as to generate an output signal which represents the output of said receiver.

4. A receiver as claimed in claim 1 wherein the dynamic range of said FET frequency mixer means substantially equals the dynamic range of said local oscillator means.

5. A receiver as claimed in claim 4 further comprising operational amplifier means having an input connected to said generator means and a single output line for providing said control signal.

* * * * *